(12) United States Patent
Huang et al.

(10) Patent No.: US 8,101,530 B2
(45) Date of Patent: Jan. 24, 2012

(54) LITHOGRAPHY PATTERNING METHOD

(75) Inventors: I-Hsiung Huang, Hukou Shiang (TW); Chin-Hsiang Lin, Hsin-Chu (TW); Heng-Jen Lee, Baoshan Township, Hsinchu County (TW); Heng-Hsin Liu, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 12/566,853

(22) Filed: Sep. 25, 2009

(65) Prior Publication Data

US 2011/0076843 A1    Mar. 31, 2011

(51) Int. Cl.
*H01L 21/31* (2006.01)
*H01L 21/469* (2006.01)

(52) U.S. Cl. ........ 438/780; 438/769; 438/795; 438/942; 257/E21.007; 257/E21.027; 257/E21.058; 257/E21.126; 257/E21.127; 257/E21.17; 257/E21.134; 257/E21.229; 257/E21.264; 257/E21.267; 257/E21.347; 257/E21.421

(58) Field of Classification Search ............. 438/197, 438/199, 311, 603, 604, 933, 706, 745, 680, 438/780, 781, 795, 798, 769, 782; 257/E21.007, 257/27, 58, 126, 127, 134, 17, 229, 264, 257/267, 347, 421
See application file for complete search history.

(56) References Cited

U.S. PATENT DOCUMENTS

| | | | | |
|---|---|---|---|---|
| 6,576,562 | B2 * | 6/2003 | Ohuchi et al. | 438/725 |
| 6,641,971 | B2 * | 11/2003 | Huang et al. | 430/189 |
| 7,482,280 | B2 * | 1/2009 | Chang et al. | 438/725 |
| 7,759,253 | B2 * | 7/2010 | Chang | 438/706 |

OTHER PUBLICATIONS

Haiping Lin, "Conductive Polymers", Power Point Presentation, Jul. 23, 2005, 16 pages.

* cited by examiner

*Primary Examiner* — David Nhu
(74) *Attorney, Agent, or Firm* — Haynes and Boone, LLP

(57) ABSTRACT

A method for fabricating an integrated circuit device is disclosed. The method is a lithography patterning method that can include providing a substrate; forming a protective layer over the substrate; forming a conductive layer over the protective layer; forming a resist layer over the conductive layer; and exposing and developing the resist layer.

20 Claims, 7 Drawing Sheets

LITHOGRAPHY PATTERNING METHOD

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, as technology nodes continue to decrease, lithography methods are implemented to pattern smaller features, such as extreme ultraviolet (EUV) lithography and/or electron beam (e-beam) lithography methods. EUV and e-beam lithography methods provide improved patterning of small features. However, due to the shorter wavelengths and higher energy of these lithography methods, it has been observed that device damage may occur to the devices being manufactured.

Accordingly, what is needed is a method for manufacturing an integrated circuit device that addresses these issues.

SUMMARY

The present disclosure provides for many different embodiments. An exemplary lithography patterning method comprises providing a substrate; forming a first material layer including a non-conjugated polymer over the substrate; forming a second material layer including a conjugated polymer over the first material layer; forming a third material layer over the second material layer; and utilizing an extreme ultraviolet (EUV) lithography process or an electron-beam (e-beam) lithography process to pattern the third material layer.

In an embodiment, the lithography patterning method comprises providing a substrate; forming a protective layer over the substrate; forming a conductive layer over the protective layer; and forming a resist layer over the conductive layer. The protective layer may be configured to protect the substrate from electron discharge or electron transfer. The conductive layer may be configured to provide an electron transfer path or charge dissipation path. The method further includes performing an exposing and developing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
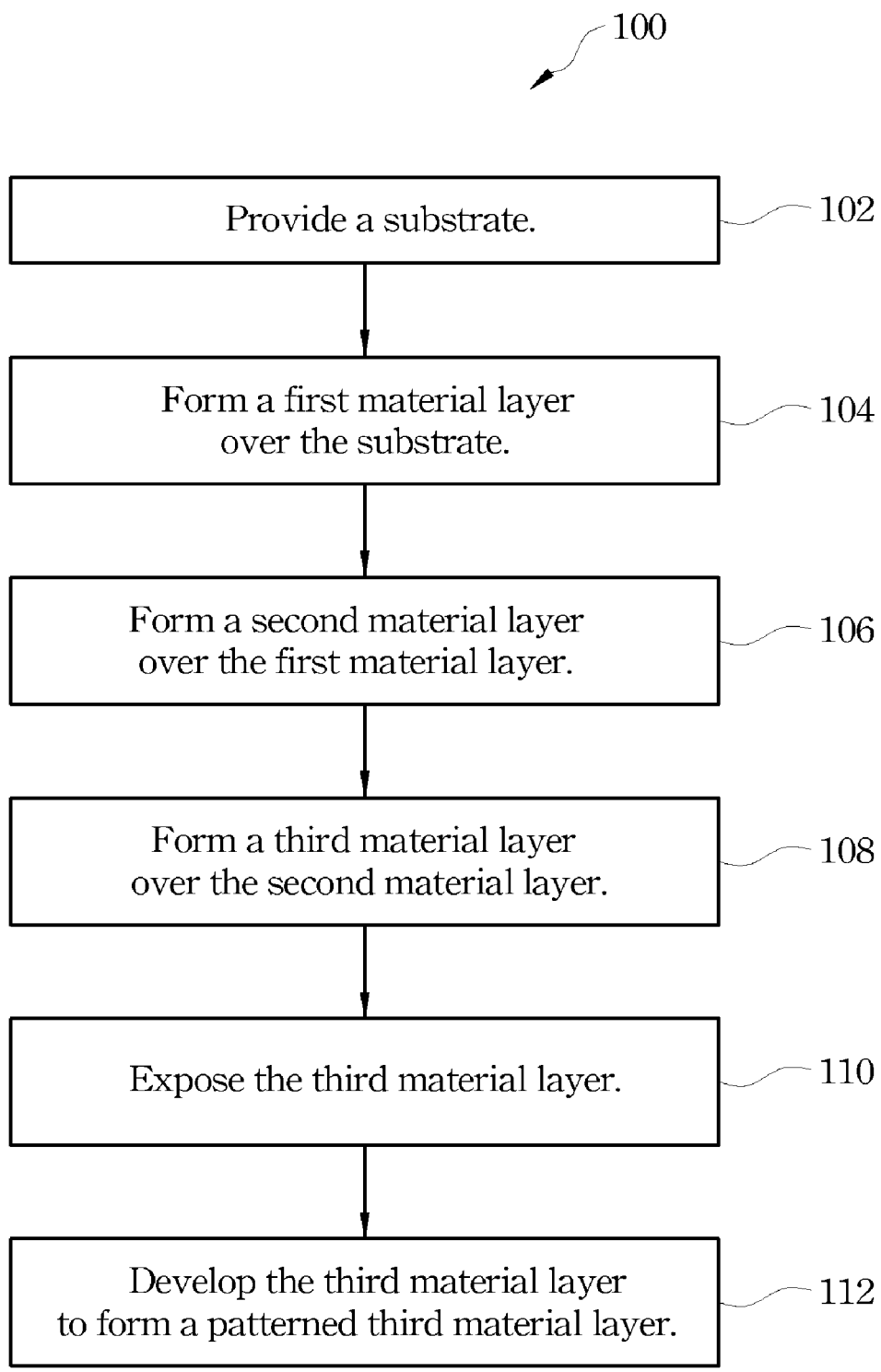
FIG. 1 is a flow chart of a method for fabricating an integrated circuit device according to aspects of the present disclosure.

The present disclosure relates generally to methods for manufacturing semiconductor devices, and more particularly, to patterning methods for manufacturing these semiconductor devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature (and like descriptions) may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

With reference to FIG. 1 and FIGS. 2A-2F, a method 100 and a semiconductor device 200 are collectively described below. FIG. 1 is a flow chart of one embodiment of the method 100 for making the semiconductor device 200. FIGS. 2A-2F are various cross-sectional views of the semiconductor device 200 according to one embodiment, in portion or entirety, during various fabrication stages of the method 100. The semiconductor device 200 is an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof.

It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200. The method 100 and the corresponding semiconductor device 200 is exemplary only and not intended to be limiting. For example, the structure of the IC device depicted in FIGS. 2A-2F is exemplary only and similar methods may be used to form any similar device.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Figure 2A:
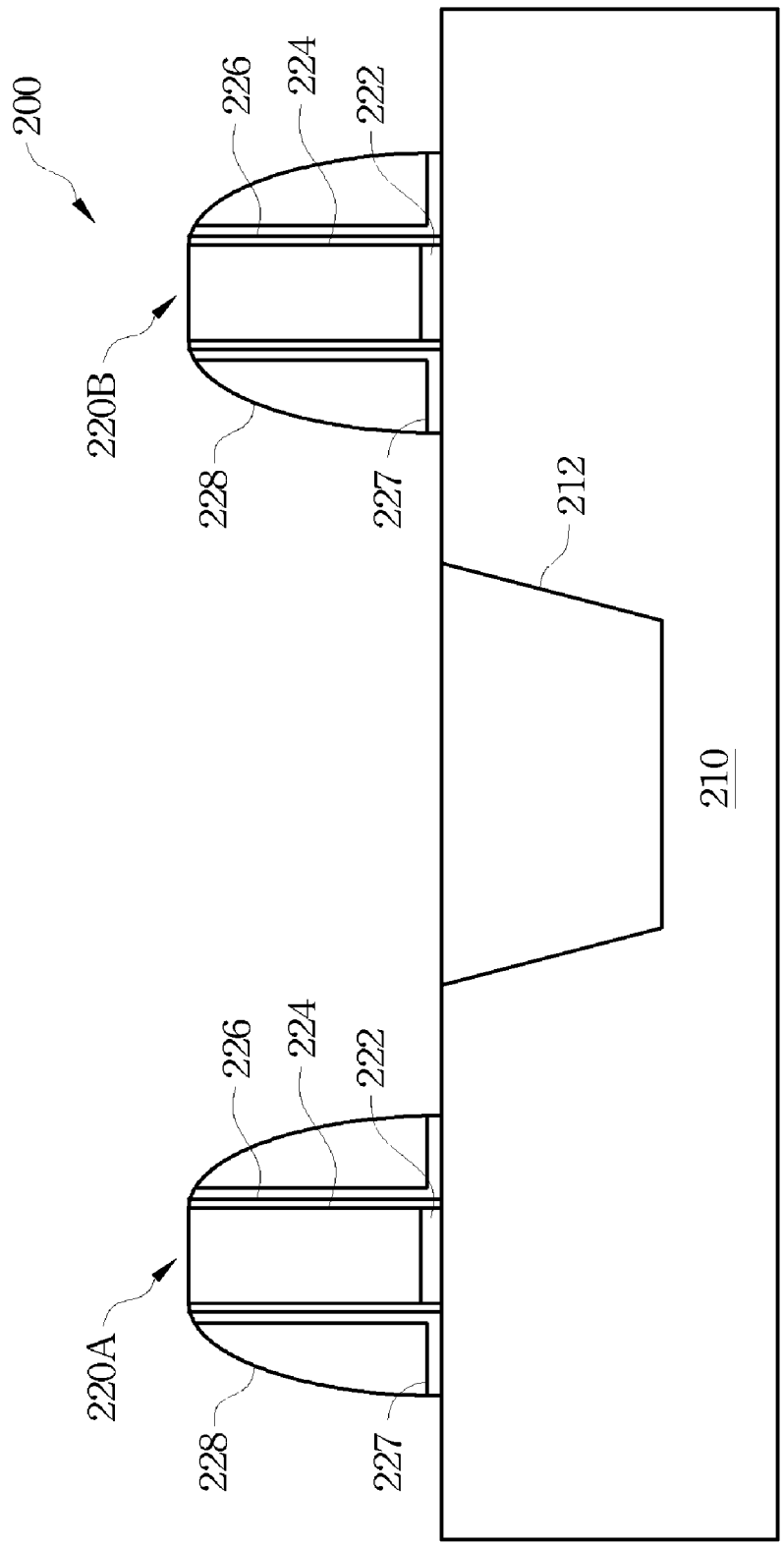
FIGS. 2A-2F are various cross-sectional views of embodiments of an integrated circuit device during various fabrication stages according to the method of FIG. 1.

Referring to FIGS. 1 and 2A, the method 100 begins at block 102 by providing a substrate 210. The substrate 210 is a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate may include a doped epi layer. In other examples, the silicon substrate may include a multilayer compound semiconductor structure.

The substrate 210 includes various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS device) and regions configured for a P-type metal-oxide-semiconductor transistor device (referred to as a PMOS device). It is understood that the semiconductor device 200 may be formed by CMOS technology processing, and thus some processes are not described in detail herein.

One exemplary isolation region 212 is formed on the substrate 210 to isolate various regions of the substrate. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

One or more gate structures 220A, 220B may be formed over the substrate 210. The gate structures are formed by any suitable process. For example, the gate structures are formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching). The etching processes also include either purely chemical (wet etching), purely physical (ion milling), and/or combinations thereof. It is understood that the gate structures may be formed simultaneously, utilizing the same processing steps and processing materials; independently of one another, utilizing varying processing steps and processing materials; or using a combination of simultaneous and independent processing steps and processing materials.

In the present embodiment, the gate structures 220A, 220B comprise gate stacks including an interfacial layer 222 and gate layer 224; sealing layer 226; gate spacer liner 227; and gate spacers 228. The gate stack is formed by any suitable process, including the processes described herein. In one example, an interfacial layer and gate layer are deposited over the substrate 210. Then, a layer of photoresist is formed over the gate layer by a suitable process, such as spin-on coating, and patterned to form a patterned photoresist feature. The pattern of the photoresist can then be transferred by a dry etching process to the underlying layers (i.e., the interfacial layer and gate layer) to form the gate stacks. The photoresist layer may be stripped thereafter. In another example, a hard mask layer is formed over the gate layer; a patterned photoresist layer is formed on the hard mask layer; the pattern of the photoresist layer is transferred to the hard mask layer and then transferred to the gate layer and the interfacial layer to form the gate stack of the gate structures 220A, 220B. It is understood that the above examples do not limit the processing steps that may be utilized to form the gate stack.

The interfacial layer 222 is formed over the substrate 210 by any suitable process to any suitable thickness. For example, the interfacial dielectric layer 222 includes a silicon oxide layer (e.g., thermal oxide or chemical oxide). Alternatively, the interfacial layer 222 comprises silicon oxynitride (SiON).

The gate layer 224 is formed over the interfacial layer 222 by any suitable process to any suitable thickness. The gate layer 224 comprises one or more material layers including interfacial layers, high-k dielectric layers, dielectric layers, capping layers, diffusion/barrier layers, etch stop layers, conductive layers, hard mask layers, other suitable layers, and/or combinations thereof. A high-k dielectric layer can include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, other suitable high-k dielectric materials, and/or combinations thereof. A gate layer can include silicon-containing materials; germanium-containing materials; metal, such as aluminum, copper, tungsten, titanium, tantulum, titanium nitride, tantalum nitride, nickel silicide, cobalt silicide, TaC, TaSiN, and/or TaCN; other suitable materials; and/or combinations thereof. In an example, the gate layer comprises a layer of silicon dioxide and a layer of high-k dielectric material. The gate layer may be doped polycrystalline silicon with the same or different doping. The gate layer may comprise a work function layer. For example, the gate structure 220A may be configured for a PMOS device, and gate structure 220B may be configured for a NMOS device, or vice versa. If a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some examples, the work function layer includes doped-conducting metal oxide materials.

A sealing layer 226 may be formed on the sidewalls of the gate stacks of the gate structures 220A, 220B. In the present embodiment, the sealing layer 226 is formed on the sidewalls of the interfacial layer 222 and gate layer 224. The sealing layer 226 includes a dielectric material, such as silicon nitride, silicon oxide, silicon oxynitride, other suitable material, and/or combinations thereof. The sealing layer 226 may include a single layer or multiple layer configuration. The sealing layer 226 is formed by any suitable process to any suitable thickness.

Spacer liner 227 and gate spacers 228 may further be formed. The spacer liner 227 and gate spacers 228 are formed by any suitable process to any suitable thickness. The spacer liner 227 may comprise an oxide material (e.g., silicon oxide), and the gate spacers 228, which are positioned on each side of the gate structures 220A, 220B, may comprise a nitride material (e.g., silicon nitride). In various examples, the gate spacers 228 comprise a dielectric material such as silicon nitride, silicon oxide, silicon oxynitride, other suitable materials, and/or combinations thereof. The gate spacers 228 may be used to offset subsequently formed doped regions, such as heavily doped source/drain regions.

Various doped regions may also be formed in the substrate 210. For example, various doped regions comprise lightly doped source/drain (LDD) regions and source/drain (S/D) regions (also referred to as heavily doped S/D regions). The LDD regions and S/D regions are formed by one or more ion implantation processes, photolithography, diffusion, and/or other suitable processes. The doping species may depend on the type of device being fabricated, such as an NMOS or PMOS device. For example, the LDD regions and S/D regions are doped with p-type dopants, such as boron or $BF_2$; n-type dopants, such as phosphorus or arsenic; and/or combinations thereof. The LDD regions and S/D regions may comprise various doping profiles. It is understood that the LDD regions may be formed prior to formation of the gate spacers 228, and the LDD regions may be aligned with an outer edge of the sealing layer 226 following one or more implantation processes. Additionally, one or more annealing processes may be performed to activate the LDD regions and/or S/D regions. The annealing processes comprise rapid thermal annealing (RTA) and/or laser annealing processes. It should be noted that during a subsequent annealing process (e.g., activation process) the dopants in the LDD regions may diffuse towards the sidewalls of the gate stack such that a portion of each of the LDD regions may extend underneath a portion of the sealing layer 226. The S/D regions may be aligned with an outer edge of the spacers 228 following the one or more implantation processes. The S/D regions may further include raised S/D regions, which may be formed by one or more epitaxy processes, such that SiGe features can be formed in a crystalline state in the substrate 210. The epitaxy processes include CVD deposition techniques (e.g., vapor-phase epitaxy (VPE) and/or ultra-high vacuum CVD (UHV-CVD)), molecular beam epitaxy, and/or other suitable processes). The epitaxy process may use gaseous and/or liquid precursors, which interact with the composition of the substrate 210. Thus, a strained channel may be achieved depending on device configuration, to increase carrier mobility and enhance device performance.

One or more contact features, such as silicide regions, may also be formed. The contact features are coupled to the S/D regions. The contact features comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The contact features are formed by any suitable process, including the processes described herein. For example, the contact features may be formed by a salicide (self-aligned silicide) process. A metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. The unreacted metal material is removed thereafter. The reacted silicide may require additional thermal process to reduce the resistance of the silicide.

The semiconductor device 200 may further include one or more antireflective coating layers (e.g., a top antireflective coating layer (TARC) and/or a bottom antireflective coating layer (BARC)). Conventional processing may continue by forming additional features of the semiconductor device 200, which can involve one or more patterning processes. For example, typically, an antireflective coating layer, such as a BARC, is deposited over the substrate, and a photoresist layer is deposited over the BARC layer. The photoresist layer is then exposed and developed. As technology nodes continue to shrink, particularly to technology nodes 22 nm and below, shorter wavelength lithography methods are utilized, including extreme ultraviolet (EUV) lithography and electron-beam (e-beam) lithography. Because of the shorter wavelengths and high energy of these lithography methods, it has been observed that device damage occurs to the semiconductor device.

For example, during an EUV lithography process, when EUV photons (radiation) are absorbed, photoelectrons and secondary electrons are generated by ionization. EUV radiation can directly produce photoelectrons with energies ranging from about 80 eV to about 90 eV. These photoelectrons produce even lower energy electrons (i.e., secondary electrons) as they slow down in the resist. The secondary electrons may exhibit energies of a few to tens of eV and travel tens of nanometers inside the photoresist before initiating a chemical reaction, which essentially increases the extent of chemical reactions in the resist. These secondary electron exposures may result in loss of resolution, observable line edge roughness, and line width variation.

EUV-related device defects are attributed to the inherently ionizing energy of the EUV radiation. One issue is positive charging, due to ejection of photoelectrons freed from the top resist surface by the EUV radiation, which can lead to electrostatic discharge or partial contamination as well as device damage. Another issue is contamination deposition on the resist from ambient outgassed hydrocarbons resulting from EUV- or electron-driven reactions. E-beam lithography utilizes higher energy than EUV lithography (for example, energies greater than 2 keV), exhibiting e-beam-related device defects similar to the EUV-related device defects. Thus, the present disclosure introduces a conductive layer and a protective layer (also referred to as an antireflective coating layer) deposited between the substrate and the photoresist layer. The protective layer can provide better isolation, avoiding electron transfer or electron local charging. The conductive/dissipation layer can provide an electron transfer path or charge dissipation path to ground.

Figure 2B:
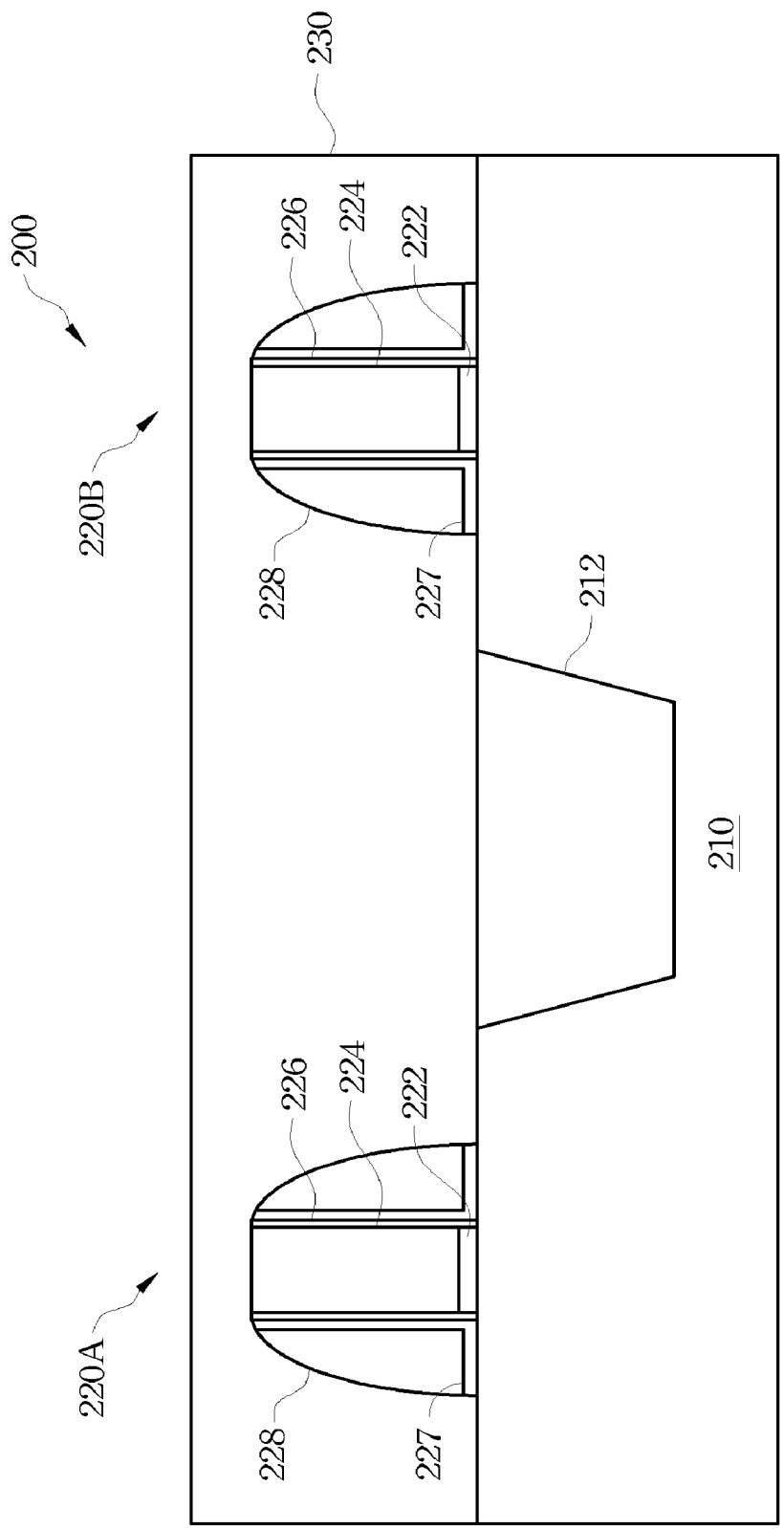

At block 104, referring to FIG. 2B, a first material layer 230 is formed over the substrate 210 by any suitable process to any suitable thickness. The first material layer 230 is a protective layer. The protective layer comprises a polymer based material. In the present example, the protective layer comprises a polymer based material including a non-conjugated polymer. The non-conjugated polymer provides isolation to the substrate (and/or semiconductor devices). The isolation protects the substrate (and/or semiconductor devices) from damage, which may be caused by electron discharge arising during subsequent processes (e.g., electron discharge occurring during an exposure process). Examples of non-conjugated polymers include:

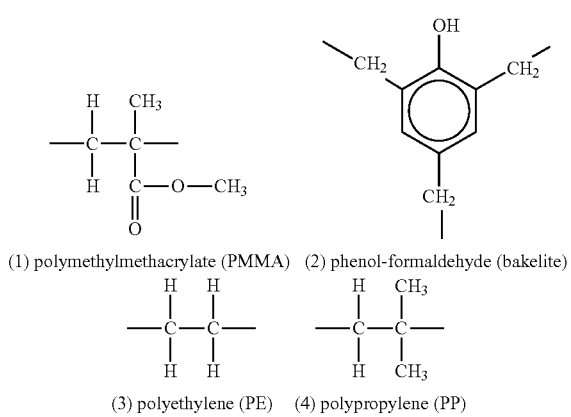

Other examples of non-conjugated polymers include poly(4-hydroxystyrene) (PHS), polycarbonate, polyester, and other suitable non-conjugated polymers. It is understood that the polymer based material of the protective layer includes one or more non-conjugated polymers, and/or any combination of non-conjugated polymers. It is further understood that the first material layer 230 may comprise a backbone formed of the non-conjugated polymers. The protective layer more effectively isolates the substrate/devices, preventing (or eliminating) electrons transferring to the substrate/devices or electron local charging, which typically induces device damage. An exemplary protective layer is an antireflective coating layer, such as a bottom antireflective coating (BARC) layer, comprising the polymer based material including one or more non-conjugated polymers.

Figure 2C:
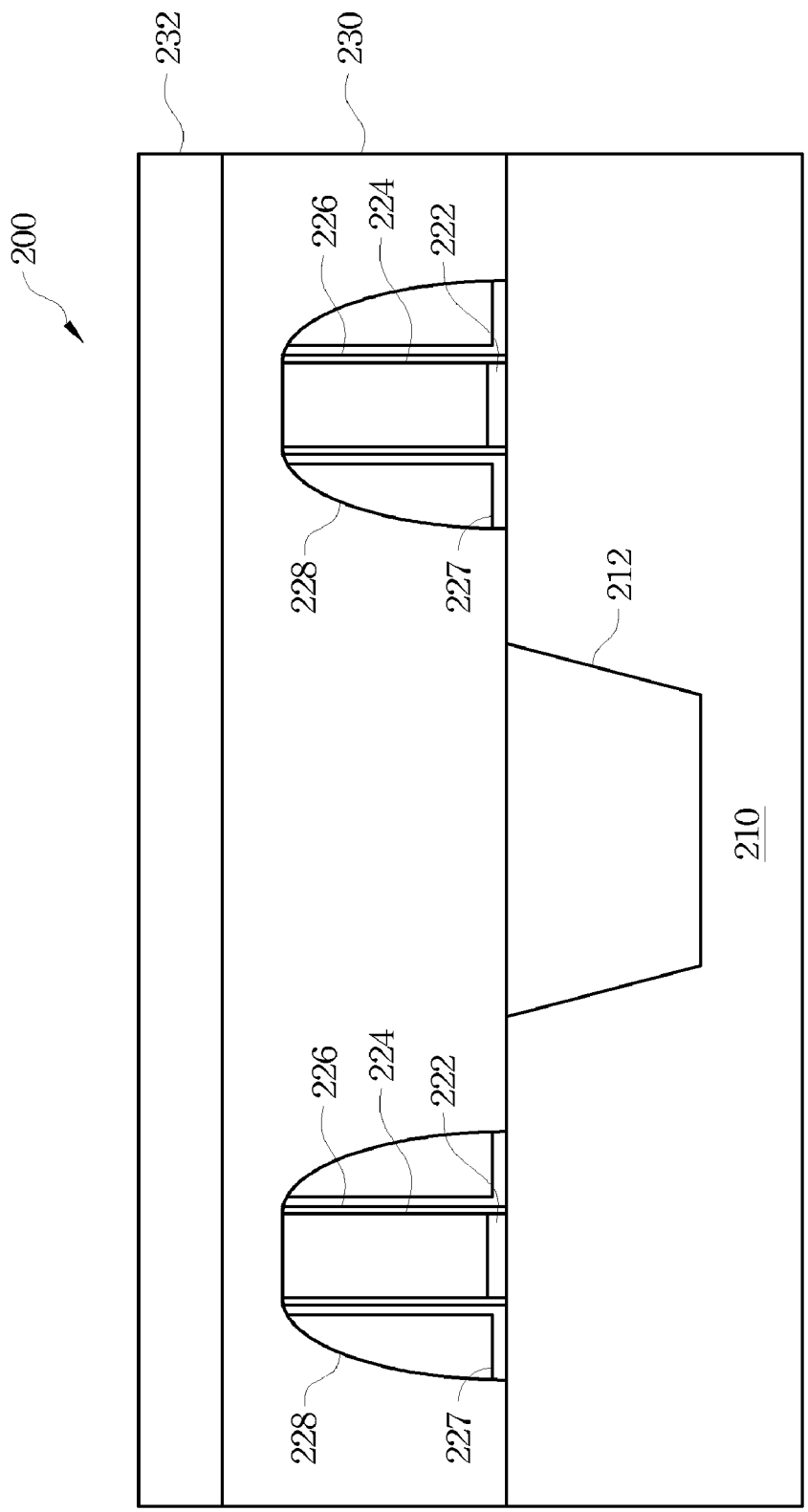

At block 106, referring to FIG. 2C, a second material layer 232 is formed over the substrate 210 by any suitable process to any suitable thickness. In the present example, the second material layer 232 is formed over the first material layer 230. The second material layer 232 is a conductive layer (also referred to as a dissipation layer). The conductive layer comprises a polymer based material. The polymer based material may be an organic type. The polymer based material exhibits an electronic structure of a conjugated polymer or an intrinsic conductivity of a conjugated polymer. For example, the conductive layer 232 comprises a backbone including a conjugated polymer. The conjugated polymer can include polyaromatic polymers, polyheteroaromatic polymers, aromatic polymers in combination with a vinyl polymer, aromatic polymers in combination with a lone electron pair, and/or other suitable polymers. Exemplary conducting polymers include:

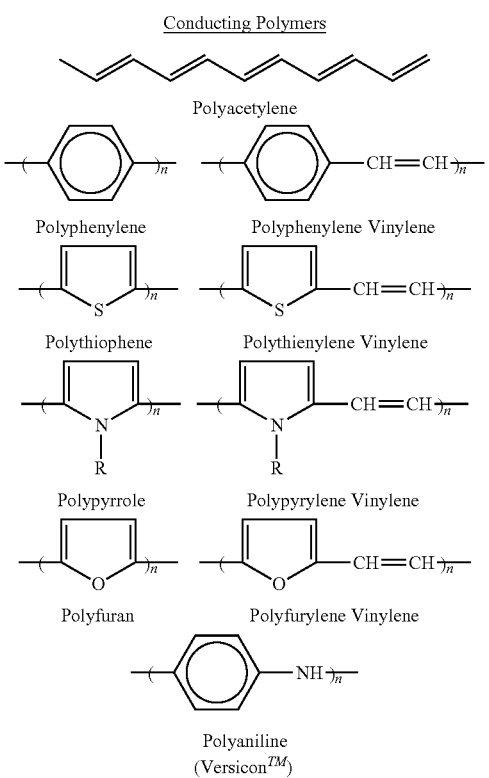

It is understood that the polymer based material for the conductive layer can include one or more conjugated polymers, and/or any combination of conjugated polymers. The conjugated polymer can provide a place for charge transfer, including an electron transfer path or a charge dissipation path, for example, to ground.

Figure 2D:
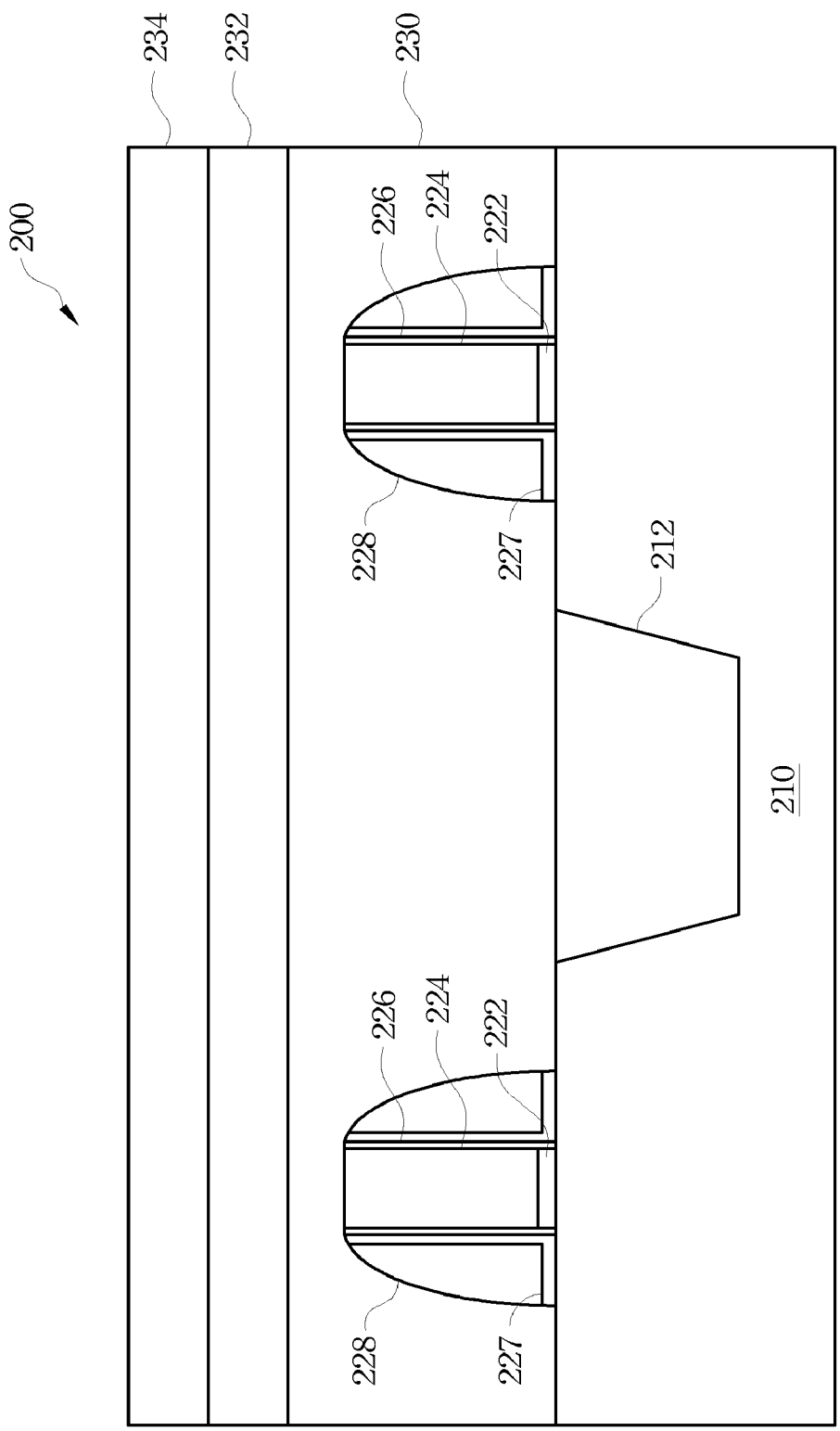

At block 108, referring to FIG. 2D, a third material layer 234 is formed over the substrate 210. In the present example, the third material layer 234 is formed over the first and second material layers 230, 232 (i.e., the protective and conductive layers). The third material layer 234 is a photoresist (resist) layer coated over the substrate 210 to any suitable thickness by any suitable process, such as spin-on coating. The photoresist layer is a positive-type or negative-type resist material. The photoresist layer may have a multi-layer structure. One exemplary resist material is a chemical amplifying (CA) resist. The resist layer comprises at least one of a polymer, a photoacid generator (PAG), a quencher (base), a chromophore, a solvent, a surfactant, a photodegradable base, a photobase generator (PBG), an electron acceptor, a crosslinker, and/or other suitable component. The polymer comprises an organic and/or inorganic polymer. The polymer may include an acid cleavable polymer, an acid catalyzed crosslinkable polymer, a polymeric pinacol, and/or other suitable polymer. In the present example, the photoresist layer 234 comprises an EUV resist or e-beam resist material. The EUV resist or e-beam resist material can comprise PHS polymers, PMMA polymers, novolac polymers, and/or other suitable polymers.

Figure 2E:
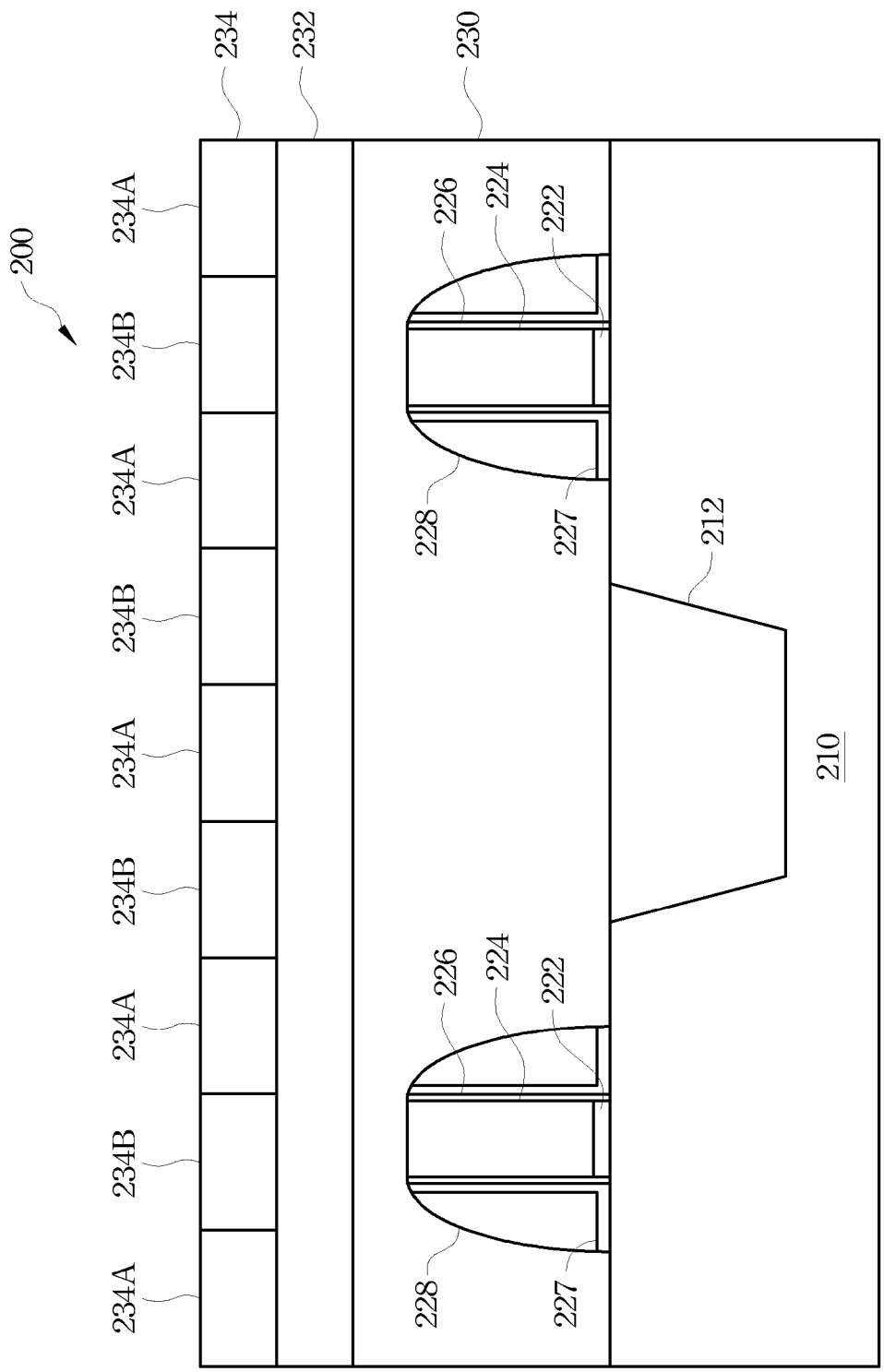

At block 110, at least one exposure process is performed on the third material layer (photoresist layer) 234. The exposure process selectively illuminates the photoresist layer 234 by a radiation beam to form one or more exposed portions 234A and unexposed portions 234B as illustrated in FIG. 2E. In the present example, the radiation beam used to expose the photoresist layer 234 includes extreme ultraviolet (EUV) radiation and/or electron-beam (e-beam) writing. Alternatively, the exposure process may utilize other radiation beams, such as ion beam, x-ray, deep ultraviolet, and other proper radiation energy. The patterned exposed and unexposed portions 234A, 234B are formed by illuminating material layer with a radiation source through one or more photomasks (or reticles) to form an image pattern. The process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam (e-beam) writing. The exposing process may also be implemented or replaced by other proper methods such as maskless photolithography, ion-beam writing, and/or molecular imprint techniques. It is understood that the third material layer can be exposed to a wavelength substantially less than 250 nm. It is further understood that a single exposure patterning process, double exposure patterning process, or multiple exposure patterning process may be performed. For example, the photoresist layer 234 may be exposed to a first wavelength, and then, exposed to a second wavelength.

Figure 2F:
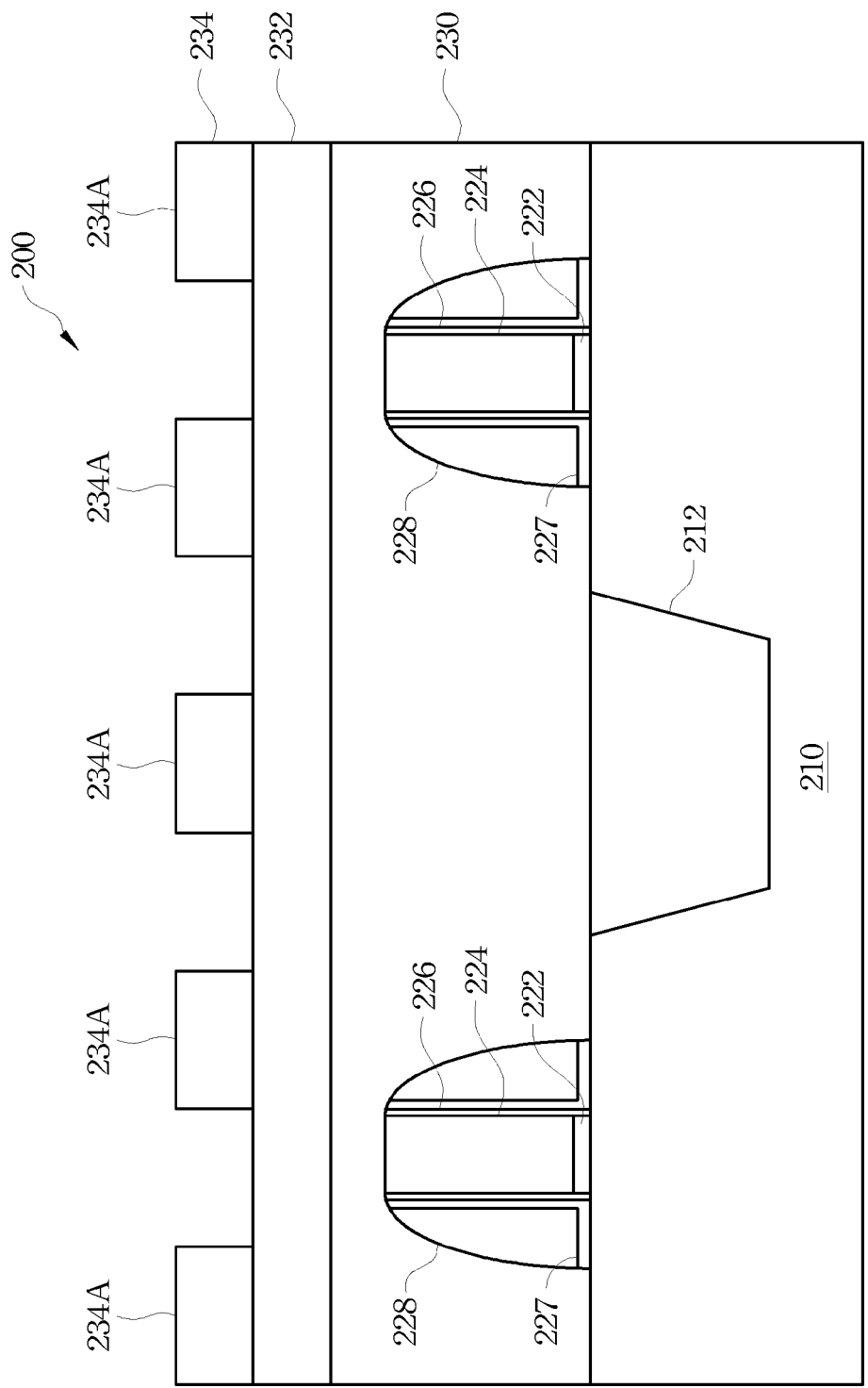

Subsequently, the third material layer 234 may be subjected to a post-exposure bake (PEB) process. Referring to FIG. 2F, at block 112, the third material layer 234 is developed by any suitable process to form a pattern in the third material layer 234. A developing solution may be utilized to remove portions of the third material layer 234. An example of a developing solution is tetramethylammonium hydroxide (TMAH). Any concentration level of TMAH developer solution may be utilized, such as approximately 2.38% TMAH developer solution. The developing solution may remove the exposed or unexposed portions 234A, 234B depending on the resist type. For example, in the present example, the third material layer 234 comprises a negative-type resist, so the exposed portions 234A are not dissolved by the developing solution and remain over the second material layer 232 (or substrate 210). If the third material layer 234 comprises a positive-type resist, the exposed portions 234A would be dissolved by the developing solution, leaving the unexposed portions 234B behind. The semiconductor device may then be subjected to a rinsing process, such as a de-ionized (DI) water rinse. The rinsing process may remove residue particles.

The remaining exposed portions 234A (or unexposed portions 234B) define a pattern. The pattern contains one or more openings, wherein portions of the underlying second material layer 232 (or first material layer 230 or substrate 210) are exposed. Subsequent processing may include removing the exposed portions of the second material layer 232, first material layer 230, and/or substrate 210 within the openings. Alternatively, metal deposition, ion implantation, or other processes can be carried out over/on the second material layer 232, first material layer 230 and/or substrate 210. The patterned third material layer 234 (i.e., remaining portions of the third material layer 234) may then be removed (or stripped) by any suitable process. For example, the patterned third material layer 234 may be removed with a fluid (or stripping solution). In some instances, where the patterned third material layer 234 is subjected to an ion bombardment or plasma treatment process, the fluid strips the ion bombarded, patterned third material layer 234 and/or the plasma treated, patterned third material layer 234. After the patterned third material layer 234 is removed, subsequent processing continues. For example, the semiconductor device 200 may be subjected to one or more processes, such as additional patterning, etching, deposition, etc. processes, to form additional features of the semiconductor device 200.

In summary, the disclosed embodiments provide a method for fabricating an integrated circuit device. An exemplary photolithography process may include processing steps of photoresist coating, soft baking, mask aligning, exposing, post-exposure baking, developing, hard baking, and/or photoresist stripping. The lithography process forms a protective layer and a conductive layer between a photoresist layer and a substrate. As noted above, the protective and conductive layers effectively reduce (or eliminate) damage to the substrate (and/or devices) during subsequent processing, such as exposure processes (e.g., EUV or e-beam processes), etching processes, spin-dry processes, etc. The protective layer may provide improved isolation of the substrate/devices, protecting the substrate/devices from electron discharge and preventing (or eliminating) electron transfer. The conductive/dissipation layer can provide an electron transfer path and/or provide for charge dissipation to ground. It is understood that the first, second, or third material layer (protective, conductive, or photoresist layer) may include an antireflective layer, for example, a top antireflective layer and/or a bottom antireflective layer. It is further understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography patterning method, the method comprising:

providing a substrate;

forming a first material layer including a non-conjugated polymer over the substrate;

forming a second material layer including a conjugated polymer over the first material layer;

forming a third material layer over the second material layer;

utilizing an extreme ultraviolet (EUV) lithography process or an electron-beam (e-beam) lithography process to pattern the third material layer, the patterned third material layer includes a plurality of openings that expose the second material layer; and applying a process to the exposed second material layer using only the patterned third material layer as a processing mask.

2. The method of claim 1 wherein forming the first material layer including the non-conjugated polymer comprises providing the first material layer with a backbone of non-conjugated polymers.

3. The method of claim 2 further comprising selecting the non-conjugated polymer from at least one of polymethylmethacrylate, phenol-formaldehyde, polyethylene, polypropylene, poly(4-hydroxystyrene), polycarbonate, polyester, or combination thereof.

4. The method of claim 1 wherein forming the second material layer including a conjugated polymer comprises providing the second material layer with a backbone of conjugated polymers.

5. The method of claim 4 further comprising selecting the conjugated polymer from at least one of a polyaromatic polymer, a polyheteroaromatic polymer, or combination thereof.

6. The method of claim 1 wherein forming the third material layer comprises depositing or coating an EUV or e-beam resist material.

7. The method of claim 1 wherein utilizing the EUV or e-beam lithography process to pattern the third material layer comprises:
  exposing the third material layer to radiation;
  developing the third material layer to form a patterned third material layer; and
  performing one or more processes on the second material layer, the first material layer, and/or the substrate.

8. The method of claim 1, wherein providing the substrate includes providing a gate structure formed on the substrate, and
  wherein forming the first material layer including a non-conjugated polymer over the substrate includes forming the first material layer on the gate structure.

9. A lithography patterning method, the method comprising:
  providing a substrate;
  forming a protective layer over the substrate;
  forming a conductive layer over the protective layer;
  forming a resist layer over the conductive layer;
  exposing and developing the resist layer to form a patterned resist layer, the patterned resist layer including a plurality of openings that expose the conductive layer; and
  performing a process to the exposed conductive layer using only the patterned resist layer as a processing mask.

10. The method of claim 9 further comprising performing a post-exposure baking process.

11. The method of claim 9 wherein exposing the resist layer comprises utilizing an EUV exposure process or e-beam exposure process.

12. The method of claim 9 wherein forming the protective layer comprises depositing or coating a material layer including a non-conjugated polymer.

13. The method of claim 12 further comprising selecting the non-conjugated polymer from at least one of polymethylmethacrylate, phenol-formaldehyde, polyethylene, polypropylene, poly(4-hydroxystyrene), polycarbonate, and/or polyester.

14. The method of claim 9 wherein forming the conductive layer comprises depositing or coating a material layer including a polymer that exhibits an electronic structure of a conjugated polymer or an intrinsic conductivity of a conjugated polymer.

15. The method of claim 9 wherein forming the conductive layer comprises depositing or coating a material layer including a conjugated polymer.

16. The method of claim 15 further comprising selecting the conjugated polymer from at least one of a polyacetylene, a polyphenylene, a polythiophene, a polypryrrole, a polyfuran, a polyaniline, a polyphenylene vinylene, a polythienylene vinylene, a polypyrylene vinylene, or a polyfurylene vinylene.

17. The method of claim 9 wherein forming the resist layer comprises forming an EUV resist layer or an e-beam resist layer.

18. The method of claim 17 wherein forming the EUV or e-beam resist layer comprises including in the EUV or e-beam resist layer a poly(4-hydroxystyrene) polymer, a polymethylmethacrylate polymer, a novolac polymer, or combination thereof.

19. The method of claim 9 wherein performing the process to the conductive layer includes the process being one of a deposition process, an etching process, and an implantation process.

20. A lithography patterning method comprising:
  providing a substrate;
  forming an antireflective coating (ARC) layer over the substrate, wherein the ARC layer is configured to protect the substrate from electron discharge or electron transfer;
  forming a conductive layer over a protective layer, wherein the conductive layer is configured to provide an electron transfer path or a charge dissipation path;
  forming a photoresist layer over the conductive layer;
  performing an exposure process;
  performing a developing process; and
  performing an etching process.

* * * * *